US008222682B2

(12) United States Patent
Watanabe et al.

(10) Patent No.: US 8,222,682 B2
(45) Date of Patent: Jul. 17, 2012

(54) PHOTOELECTRIC CONVERSION APPARATUS AND IMAGE PICKUP SYSTEM USING PHOTOELECTRIC CONVERSION APPARATUS

(75) Inventors: Takanori Watanabe, Yamato (JP); Masaaki Iwane, Sagamihara (JP); Yukihiro Kuroda, Ebina (JP); Masahiro Kobayashi, Tokyo (JP); Yasushi Nakata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/079,381

(22) Filed: Apr. 4, 2011

(65) Prior Publication Data

US 2011/0175151 A1 Jul. 21, 2011

Related U.S. Application Data

(63) Continuation of application No. 11/776,289, filed on Jul. 11, 2007, now Pat. No. 7,935,995.

(30) Foreign Application Priority Data

Aug. 1, 2006 (JP) ................................. 2006-209757

(51) Int. Cl.
*H01L 31/062* (2012.01)
(52) U.S. Cl. ...................................................... 257/292
(58) Field of Classification Search .................. 257/292, 257/233, E31.085
See application file for complete search history.

(56) References Cited

U.S. PATENT DOCUMENTS

| 5,387,536 | A | 2/1995 | Guidash et al. | |
|---|---|---|---|---|
| 6,657,665 | B1 * | 12/2003 | Guidash | 348/308 |
| 6,731,337 | B2 | 5/2004 | Watanabe | 348/308 |
| 7,193,258 | B2 | 3/2007 | Hara et al. | |
| 7,462,810 | B2 | 12/2008 | Kobayashi et al. | 250/208.1 |
| 7,638,826 | B2 | 12/2009 | Hiyama et al. | |
| 2004/0141077 | A1 | 7/2004 | Ohkawa | 348/308 |
| 2005/0184322 | A1 * | 8/2005 | Inoue | 257/292 |
| 2006/0043393 | A1 | 3/2006 | Okita et al. | 257/93 |
| 2006/0044434 | A1 | 3/2006 | Okita et al. | 348/294 |
| 2006/0061674 | A1 | 3/2006 | Iida et al. | 348/308 |
| 2008/0029793 | A1 | 2/2008 | Watanabe et al. | 257/291 |

FOREIGN PATENT DOCUMENTS

| JP | 07-263662 A | 10/1995 |
|---|---|---|
| JP | 2000-232216 A | 8/2000 |
| JP | 2002-118249 A | 4/2002 |
| JP | 2002-270810 A | 9/2002 |
| JP | 2005-268537 A | 9/2005 |
| JP | 2006-073733 A | 3/2006 |
| JP | 2006-186187 A | 7/2006 |

OTHER PUBLICATIONS

Office Action dated Dec. 6, 2011 in Japanese Patent Appln. No. 2006-209757.

* cited by examiner

*Primary Examiner* — Bradley K Smith
(74) *Attorney, Agent, or Firm* — Fitzpatrick, Cella, Harper & Scinto

(57) ABSTRACT

A photoelectric conversion apparatus includes a plurality of photoelectric conversion elements configured to convert incident light to electric carriers, an amplifier MOS transistor shared by the plurality of photoelectric conversion elements, a plurality of floating diffusions connected to the gate electrode of the amplifier MOS transistor, and a plurality of transfer MOS transistors arranged corresponding to the respective photoelectric conversion elements, each of the transfer MOS transistors transferring electric carriers from corresponding one of the photoelectric conversion elements to corresponding one of the floating diffusions. In such a photoelectric conversion apparatus, at least two of the floating diffusions are electrically connected to each other with a wiring line included in the same wiring layer as the gate electrode of the amplifier MOS transistor.

7 Claims, 9 Drawing Sheets

PHOTOELECTRIC CONVERSION APPARATUS AND IMAGE PICKUP SYSTEM USING PHOTOELECTRIC CONVERSION APPARATUS

CROSS REFERENCE TO RELATED APPLICATION

This application is a continuation of U.S. application Ser. No. 11/776,289 filed on Jul. 11, 2007, the entire disclosure of which is incorporated herein by reference.

BACKGROUND OF THE INVENTION

1. Field of the Invention

The present invention relates to a photoelectric conversion apparatus and an image pickup system using a photoelectric conversion apparatus.

2. Description of the Related Art

Recently, as photoelectric conversion apparatuses have been developed, high-definition and inexpensive digital cameras have become widespread. In particular, the performance of metal oxide semiconductor (MOS) type photoelectric conversion apparatuses, in which each pixel includes an active element and peripheral circuits can be mounted on the same chip, has been significantly improved, and MOS type photoelectric conversion apparatuses are partially replacing charge-coupled device (CCD) sensors. In a MOS type photoelectric conversion apparatus, photodiodes (hereinafter called photoelectric conversion elements) that convert light to electric carriers are arranged in, for example, a two-dimensional array. Each of the photoelectric conversion elements outputs electric carriers to a reading circuit. Electric carriers are first transferred from each of the photoelectric conversion elements to a floating diffusion (FD) and retained in the FD. The gate electrode of an amplifier MOS transistor is connected to the FD, and signals based on the electric carriers in the FD are amplified by a source follower operation and output to an output signal line.

Recently, as the number of pixels has been increased and the sizes have been reduced in photoelectric conversion apparatuses, a reduction in the size of a pixel that includes a photoelectric conversion element is increasingly required even in MOS type photoelectric conversion apparatuses. To this end, a method exists, in which each group of photoelectric conversion elements share a reading circuit that includes an amplifier MOS transistor. A method is disclosed in Japanese Patent Laid-Open No. 2000-232216, in which electric carriers are read from a plurality of photoelectric conversion elements to an FD, and each group of photoelectric conversion elements share an FD and a reading circuit. Moreover, another method is also disclosed, in which each group of photoelectric conversion elements share a reading circuit by connecting a plurality of FDs with a wiring layer.

However, in a method in which an FD and a reading circuit are shared, the layout of photoelectric conversion elements may be asymmetrical. Moreover, since a large FD is formed, the capacitance of the FD becomes large. Moreover, even when a plurality of FDs are connected, parasitic capacitance is formed between metal wiring layers used to connect the FDs and contacts, through holes, or the like for connecting the wiring layers and other wiring lines. Thus, the capacitance of the FDs is increased due to this parasitic capacitance.

When the capacitance of an FD becomes large, a gain obtained when electric carriers transferred from photoelectric conversion elements are output to an output signal line becomes small. When the gain becomes small, the sensitivity of a photoelectric conversion apparatus is decreased, and the signal-to-noise (S/N) ratio of signals is decreased.

Thus, the present invention provides a photoelectric conversion apparatus in which, when a plurality of FDs are connected, the sensitivity is increased, and image signals the S/N ratio of which is improved can be obtained.

SUMMARY OF THE INVENTION

A photoelectric conversion apparatus according to an aspect of the present invention includes a plurality of photoelectric conversion elements configured to convert incident light to electric carriers, an amplifier MOS transistor shared by the plurality of photoelectric conversion elements, a plurality of floating diffusions connected to the gate electrode of the amplifier MOS transistor, and a plurality of transfer MOS transistors arranged corresponding to the respective photoelectric conversion elements, each of the transfer MOS transistors transferring electric carriers from corresponding ones of the photoelectric conversion elements to corresponding ones of the floating diffusions. In such a photoelectric conversion apparatus, at least two of the floating diffusions are electrically connected to each other with a wiring line included in the same wiring layer as the gate electrode of the amplifier MOS transistor.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE EMBODIMENTS

A photoelectric conversion apparatus according to an embodiment of the present invention includes transfer MOS transistors that transfer electric carriers from photoelectric conversion elements to FDs and amplifier MOS transistors that output signals based on the electric carriers from the FDs. Moreover, at least two of the FDs are connected with a wiring line formed of the same layer as the gate electrodes of the amplifier MOS transistors.

According to an embodiment of the present invention, an increase in the capacitance of FDs can be reduced. Specifically, FDs can be connected without parasitic capacitance between wiring layers and contacts, through holes, or the like for connecting the wiring layers and other wiring lines. Thus, an increase in parasitic capacitance can be reduced. Moreover, since wiring lines located on the side of photoelectric conversion elements, as viewed from metal wiring layers, are used, incident light is not blocked, and the size of an aperture can be increased. Thus, an image in which a high S/N ratio is achieved can be obtained by improving the sensitivity of a sensor.

Exemplary embodiments according to the present invention will now be described in detail.

First Exemplary Embodiment

Figure 1A:
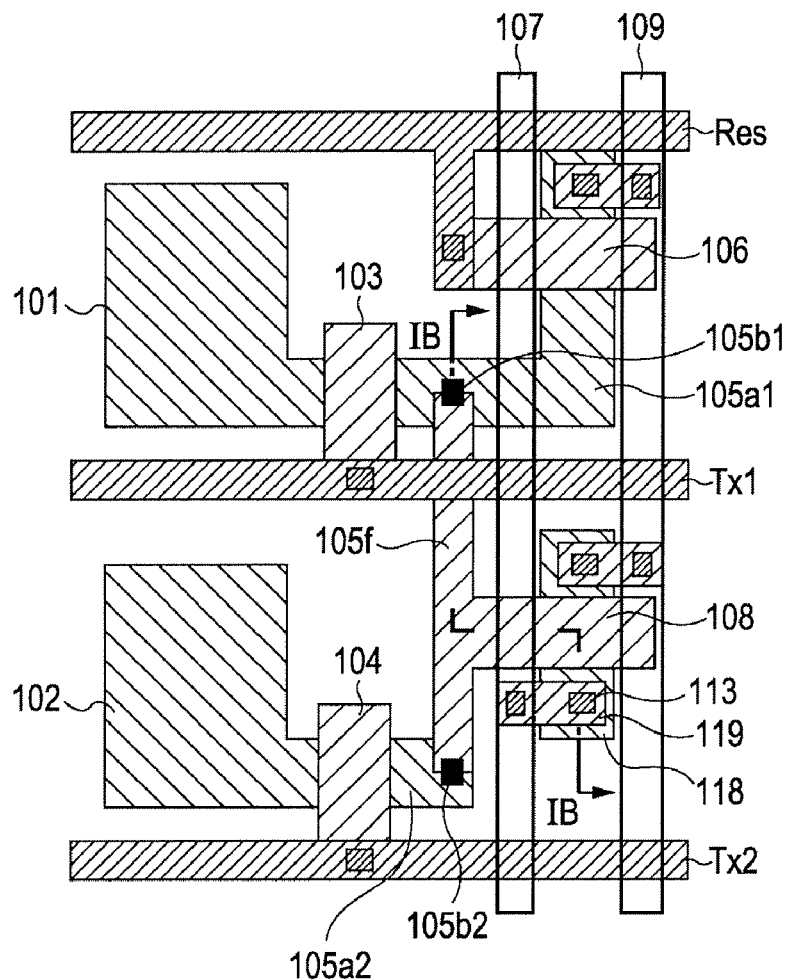
FIG. 1A is an illustration of a first exemplary embodiment.
Figure 1B:
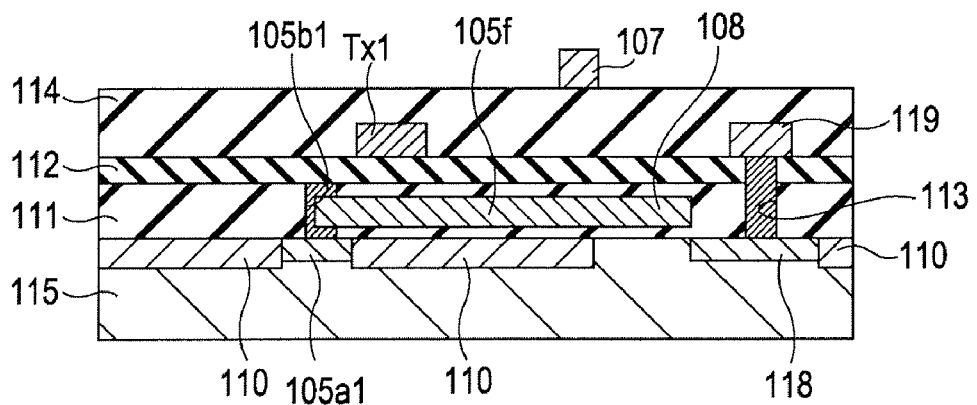
FIG. 1B is a cross sectional view taken along line IB-IB in FIG. 1A.

FIGS. 1A, 1B, 2A, and 2B are illustrations of a first exemplary embodiment. FIG. 3A is a circuit diagram of a photoelectric conversion apparatus according to the first exemplary embodiment. FIG. 3B shows exemplary drive pulses of the photoelectric conversion apparatus. FIG. 1A is the layout of a part of a circuit shown in FIG. 3A, the part being surrounded by a dotted line. FIG. 1B is a cross sectional view taken along line IB-IB in FIG. 1A.

The structure of the photoelectric conversion apparatus will first be described with reference to FIG. 3A. Photoelectric conversion elements 301 and 302 are connected to an FD 305 via transfer MOS transistors 303 and 304, respectively. The potential of the FD 305 is reset to a desired potential using a power supply line 309 connected to the FD 305 via a reset MOS transistor 306. Moreover, the potential of the FD 305 is input to the gate electrode of an amplifier MOS transistor 308. Signals based on the potential of the FD 305 are output by a source follower circuit that includes the amplifier MOS transistor 308 and a constant current source 310 via an output signal line 307. The signals are held by a sample and hold (S/H) circuit (not shown), and subsequently, desired processing, for example, correlated double sampling (CDS), is performed on the signals. Each part surrounded by a dotted line represents a unit circuit that is repeatedly disposed in a two-dimensional array. In the photoelectric conversion apparatus according to the first exemplary embodiment, two photoelectric conversion elements share a reading circuit that includes an amplifier MOS transistor and the like. In the first exemplary embodiment, a case is considered, in which a pixel is a unit that includes a photoelectric conversion element. Each part surrounded by a dotted line includes two pixels, and these pixels are arranged in a matrix.

The drive timing of the photoelectric conversion apparatus having such a structure will now be described with reference to FIG. 3B. A pulse 311 is input to the gate electrodes of reset MOS transistors in a row (hereinafter called a selected row) from which signals are read. A pulse 312 is input to the gate electrodes of reset MOS transistors in a row (hereinafter called a non-selected row) from which signals are not read. Reference character 313 denotes a change in the voltage of the power supply line 309. Reference character 314 denotes a pulse to be input, via a wiring line Tx1, to the gate electrode of the transfer MOS transistor 303, which transfers electric carriers from the photoelectric conversion element 301. Reference character 315 denotes a pulse to be input, via a wiring line Tx2, to the gate electrode of the transfer MOS transistor 304, which transfers electric carriers from the photoelectric conversion element 302. Sample and hold timing 316 is timing of sampling and holding of reset noise (N signals) output when the potential of the FD 305 is set at a reset potential.

Reset noise may include, for example, noise of another reading circuit. However, in the first exemplary embodiment, it is assumed that reset noise is that output when the potential of the FD 305 is set at the reset potential. Sample and hold timing 317 is timing of sampling and holding of signals (S signals) corresponding to electric carriers generated from light. First, the potential of FDs in a selected row is reset to a high potential, and the potential of FDs in a non-selected row is reset to a low potential. A current that flows into amplifier MOS transistors in the non-selected row is suppressed by this operation, and a potential that depends on the potential of the FDs in the selected row is output to output signal lines. Signals output at this time are sampled and held as N signals. Then, electric carriers, generated from light, in the photoelectric conversion element 301 are transferred to the FD by turning on the wiring line Tx1, and signals output at this time are sampled and held as S signals. Since the N signals, which have been read earlier, are superimposed on these S signals, signals generated from light can be obtained by obtaining the difference between the N signals and the S signals. Moreover, signals based on electric carriers, generated from light, in the photoelectric conversion element 302, noise being eliminated from the signals, can be obtained by driving the wiring line Tx2 in a similar manner.

The layout of a part of the photoelectric conversion apparatus having the aforementioned structure (i.e., the part including the photoelectric conversion elements 301 and 302 and being surrounded by a dotted line) will now be described with reference to FIGS. 1A and 1B.

In FIG. 1A, reference characters 101 and 102 denote photoelectric conversion elements, reference characters 103 and 104 denote the gate electrodes of transfer MOS transistors, and reference characters 105a1 and 105a2 denote FDs. A wiring line 105f connects the FDs 105a1 and 105a2. Hatching on the drawing, for example, the photoelectric conversion elements 101 and 102 and the FDs 105a1 and 105a2, shows active regions on a substrate. Contacts 105b1 and 105b2 connect parts (active regions) of the substrate for the FDs 105a1 and 105a2 and the wiring line 105f. Reference character 108 denotes the gate electrode of an amplifier MOS transistor. Reference character 106 denotes the gate electrode of a reset MOS transistor, and drive pulses are input from a wiring line Res to the gate electrode 106. Wiring lines Tx1 and Tx2 are used to supply drive pulses to the gate electrodes 103 and 104 of the transfer MOS transistors, respectively. An output signal line 107 is connected to the gate electrode 108 of the amplifier MOS transistor. A power supply line 109 is connected to the drain of the reset MOS transistor and the drain of the amplifier MOS transistor. The positions of other contacts, vias, and the like are indicated by boxes, the hatching of which is different from that of the contacts 105b1 and 105b2.

In FIG. 1B, the same reference characters as in FIG. 1A are assigned to corresponding components. The contact 105b1 is formed on the FD 105a1 to connect the FD 105a1 to the wiring line 105f. Reference character 113 denotes a contact. Reference character 115 denotes the substrate. Element separation regions 110 are formed on the substrate 115 and separate the active regions. Reference characters 111, 112, and 114 denote insulating films.

In the first exemplary embodiment, the gate electrodes 103 and 104 are composed of material for gate electrodes of MOS transistors, such as polysilicon. The wiring line 105f is disposed at a height such that, among a plurality of wiring layers, the wiring line 105f is nearest to the substrate 115, is composed of material for gate electrodes of MOS transistors, and is disposed in the same layer as the gate electrodes. Other wiring lines will now be described. It is assumed that a wiring pattern that is disposed at the same height as the wiring lines Tx1 and Tx2 is called a first wiring layer, and a wiring pattern that is disposed at the same height as the output signal line 107 is called a second wiring layer. The first and second wiring layers are composed of aluminum, copper, or the like that are used for wiring lines of semiconductors. In the drawing, when wiring lines are indicated by the same hatching, this means that the wiring lines are in the same wiring layer (i.e., the wiring lines are disposed at the same height).

Not only in the first exemplary embodiment but also in other cases, a semiconductor substrate that is a material substrate is expressed as a substrate. For example, the following material substrates are also expressed as a substrate: a member in which one or more than one semiconductor region or the like is formed, a member that is being processed in a manufacturing process, and a member that has been processed in a manufacturing process. Specifically, these material substrates are silicon semiconductor substrates. Moreover, a semiconductor substrate surface represents the main surface of a semiconductor substrate, on which pixels and elements are formed. A pixel includes a photoelectric conversion element. A semiconductor substrate surface represents an interface between a semiconductor substrate and, for example, an interlayer film and an anti-reflection coating that are composed of nitride, oxide, or the like and are formed on the semiconductor substrate. It is assumed that a substrate depth is a distance toward the interior of a semiconductor substrate with respect to the semiconductor substrate surface, a downward direction is a direction in which the substrate depth extends, an upward direction is opposite to the downward direction, and a height is a distance from the semiconductor substrate surface in the upward direction. An incident light side is a side from which light enters a substrate and is above the substrate.

Figure 2A:
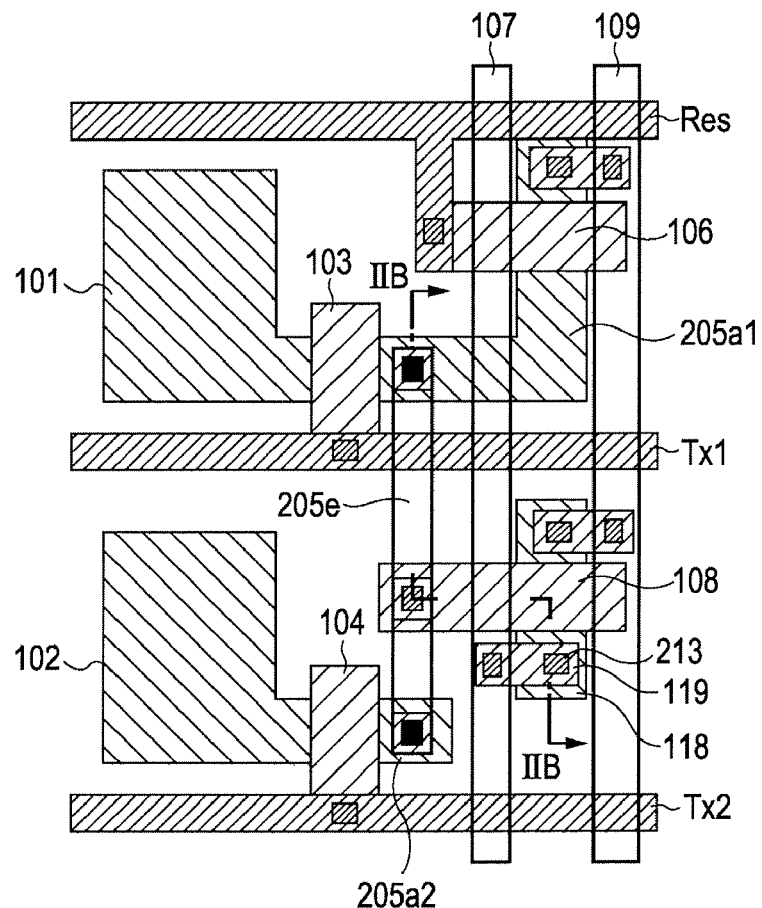
FIG. 2A is an illustration for comparison.
Figure 2B:
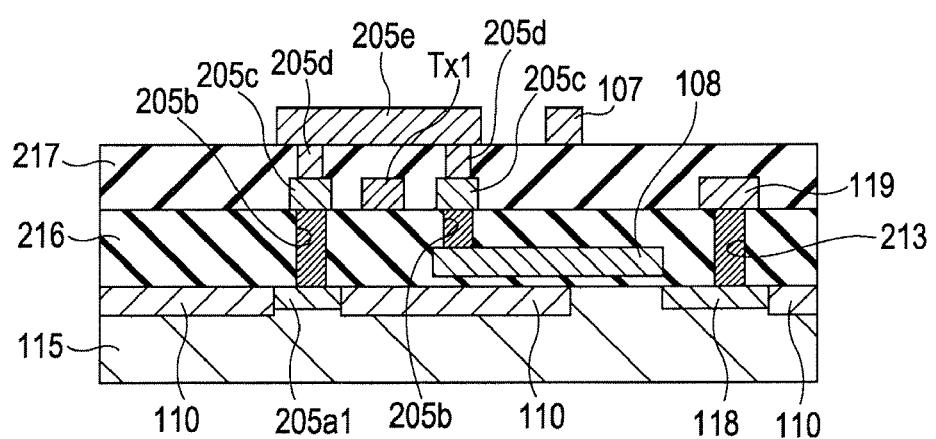
FIG. 2B is a cross sectional view taken along line IIB-IIB in FIG. 2A.
Figure 3A:
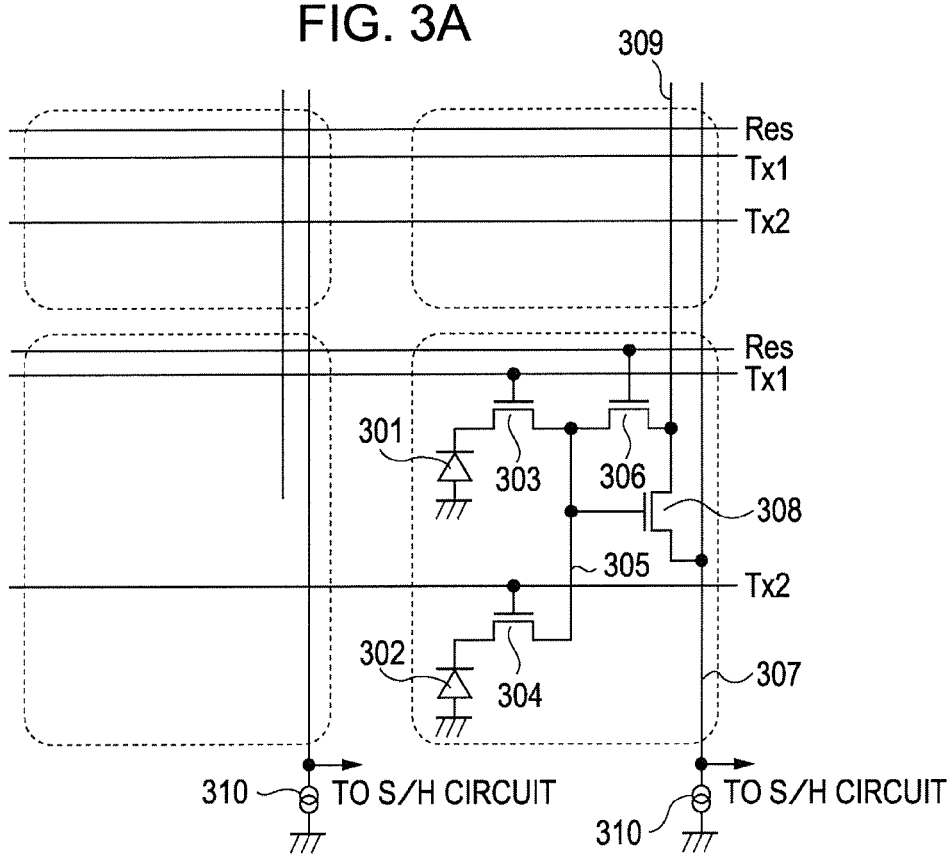
FIG. 3A is an illustration of a pixel circuit.
Figure 3B:
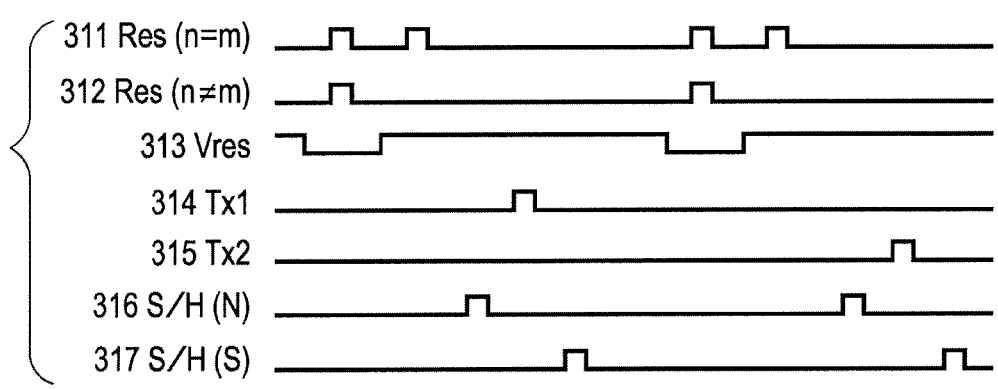
FIG. 3B is a driving timing chart.

FIG. 2A shows another layout, as viewed from the top, corresponding to an equivalent circuit diagram in FIG. 3A for comparison. FIG. 2B is a cross sectional view taken along line IIB-IIB in FIG. 2A. In FIGS. 2A and 2B, the same reference characters as in FIGS. 1A and 1B are assigned to components having functions similar to the functions of the components shown in FIGS. 1A and 1B, and the detailed description of these components is omitted here. FDs 205a1 and 205a2 are connected with a plurality of layers. In FIG. 2B, these components are shown by reference characters 205a to 205e. The FD 205a1 is connected to a first wiring layer 205c via a contact 205b. The first wiring layer 205c is connected to a second wiring layer 205e through via holes 205d. Insulating films 216 and 217 are formed under the first wiring layer 205c and the second wiring layer 205e, respectively. Insulating films may be composed of material such as SiO. A contact 213 is provided in the insulating film 216.

In a layout as shown in FIG. 2A, the FDs 205a1 and 205a2 are connected using the first wiring layer 205c, in which the wiring lines Tx1 and Tx2 are provided, as shown in FIG. 2B. Thus, in order to achieve a layout such that the wiring lines Tx1 and Tx2 are bypassed, the second wiring layer 205e, which is a wiring layer different from the wiring lines Tx1 and Tx2, needs to be used to connect the FDs 205a1 and 205a2.

On the other hand, in the first exemplary embodiment shown in FIGS. 1A and 1B, the wiring line 105f is not formed in the first and second wiring layers and is formed in the same layer as the gate electrodes. Thus, connection to the contact 205b, the first wiring layer 205c, and the via holes 205d, shown in FIG. 2B, is not necessary. Thus, capacitive coupling with surrounding wiring lines can be reduced. Accordingly, the efficiency of conversion from electric carriers transferred from the photoelectric conversion elements 101 and 102 to voltages by the FDs 105a1 and 105a2 can be improved. As a result, the sensitivity of the photoelectric conversion apparatus can be improved, and the S/N ratio of signals can be improved.

Moreover, the height of the contact 105b1 shown in FIG. 1B is lower than the height of the contact 205b shown in FIG. 2B and the height of the first wiring layer. This structure is formed by the following process: After the insulating film 111 is formed, contact holes for the contacts 105b1, 105b2, and 113 are formed. Then, after the contact holes are filled with material, for example, tungsten, the insulating film 112 is formed. Then, a contact hole is formed in a part corresponding to the contact 113 and is filled with material, for example, tungsten. Such a contact is called a shared contact, the contact being provided in a single contact hole for connecting active regions and gate electrodes, or wiring lines formed by contiguous active regions and gate electrodes. The insulating film 112 is formed below the second wiring layer. Insulating films and the like may be composed of material such as SiO. All insulating films may be composed of the same material.

When the FDs 105a1 and 105a2 are connected, a layout should be adopted, in which the wiring line 105f is aligned parallel to the output signal line 107. In this arrangement, capacitive coupling between the wiring line 105f and the output signal line 107, which are disposed in layers the heights of which are different, can be reduced. Moreover, capacitive coupling can be further reduced by disposing the wiring line 105f so that the wiring line 105f does not overlap the wiring layers, such as the output signal line 107, in the vertical direction.

Moreover, the gate electrode 108 of the amplifier MOS transistor should be disposed between the active regions of the FDs 105a1 and 105a2. This is because, in this arrangement, the wiring line 105f can connect the FDs 105a1 and 105a2 and can connect to the gate electrode 108 of the amplifier MOS transistor in substantially the shortest distance. Thus, a plurality of photoelectric conversion elements can share an amplifier MOS transistor without an increase in parasitic capacitance of FDs. For example, when two photoelectric conversion elements share an amplifier MOS transistor, the length of the wiring line 105f is substantially the same as a pixel pitch that is the distance between adjacent photoelectric conversion elements. Even when connection to the gate electrode 108 of the amplifier MOS transistor is considered, connection can be establish with a wiring line that is less than twice as long as a pixel pitch.

According to the first exemplary embodiment, even when FDs of a plurality of photoelectric conversion elements are connected and when the size of a pixel is reduced, the area of a photoelectric conversion element can be expanded. Thus, the sensitivity and the saturation level of a photoelectric conversion element can be increased. Moreover, an increase in capacitance due to connection of FDs can be suppressed. Thus, the S/N ratio of a photoelectric conversion apparatus can be improved.

Second Exemplary Embodiment

Figure 4:
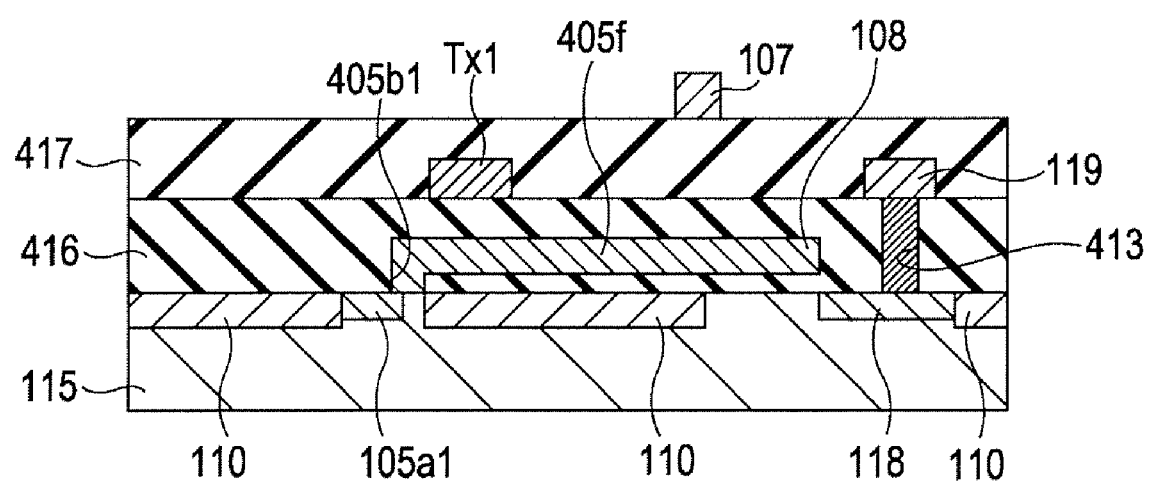
FIG. 4 is an illustration of a second exemplary embodiment.

FIG. 4 shows a structure according to a second exemplary embodiment. In the second exemplary embodiment, a method for connecting the active regions of FDs and wiring lines other than the method according to the first exemplary embodiment is shown. FIG. 4 is a cross sectional view corresponding to FIG. 1A of the first exemplary embodiment. In FIG. 4, the same reference characters as in FIG. 1A are assigned to corresponding components, and the detailed description of these components is omitted here. In the second exemplary embodiment, the active region of the FD 105a1 is connected to a wiring line 405f with a contact 405b1. The polysilicon of the wiring line 405f is brought into direct contact with the FD 105a1 at the contact 405b1. When a contact having such a structure is adopted, capacitive coupling between the contact and surrounding wiring lines can be suppressed. Moreover, the insulating film 112 shown in FIG. 1B is not provided, and only insulating films 416 and 417 are provided. Thus, the height of the wiring part can be further reduced, and the process of forming a contact 413 can be simplified.

The process of manufacturing a photoelectric conversion apparatus according to the second exemplary embodiment that includes the contact 405b1 includes a doping step for forming the active region of the FD 105a1. When this step is performed in a doping step for the sources and drains of MOS transistors, dopant may not be implanted just under the wiring line 405f. Thus, it is advised to perform the manufacturing process by thermal diffusion of dopant from polysilicon. The contact 405b1 can be brought into ohmic contact with the active region.

According to the second exemplary embodiment, in addition to advantageous effects obtained in the first exemplary embodiment, capacitive coupling between a contact and surrounding wiring lines can be suppressed. Moreover, the height of the wiring part can be further reduced, and the amount of incident light can be increased.

Third Exemplary Embodiment

Figure 5:
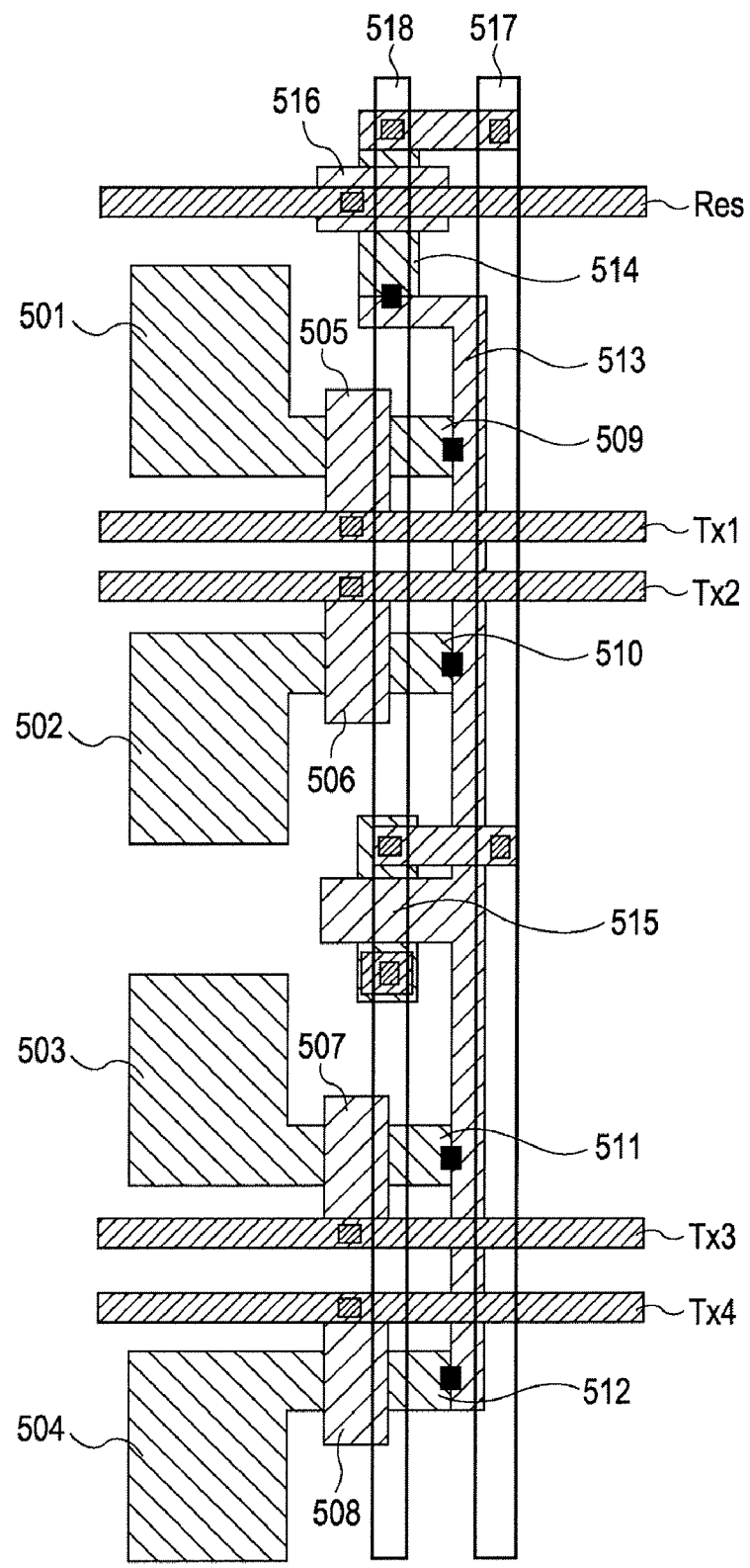
FIG. 5 is an illustration of a third exemplary embodiment.

FIG. 5 shows the layout of a structure according to a third exemplary embodiment. The third exemplary embodiment is characterized in that the individual FDs of four photoelectric conversion elements are connected. That is to say, each of the FDs is separately provided for corresponding one of the photoelectric conversion elements, and the FDs are connected to a common amplifier MOS transistor. When four photoelectric conversion elements share an FD, an advantage is achieved in that the photoelectric conversion elements can be designed so that the photoelectric conversion elements are relatively large. However, in this case, FD capacitance is increased. On the other hand, in the structure according to the third exemplary embodiment, the photoelectric conversion elements can be designed so that the photoelectric conversion elements are relatively large, and FD capacitance can be reduced.

The details of the structure shown in FIG. 5 will now be described. Reference characters 501 to 504 denote photoelectric conversion elements. Reference characters 505 to 508 denote the gate electrodes of transfer MOS transistors. Reference character 516 denotes the gate electrode of a reset MOS transistor. Wiring lines Tx1 to Tx4 are used to supply drive pulses to the gate electrodes 505 to 508 of the transfer MOS transistors, respectively. The wiring line Res is used to supply drive pulses to the gate electrode 516 of the reset MOS transistor. Reference character 517 denotes a power supply line. Reference character 518 denotes an output signal line. Reference characters 509 to 512 denote the active regions of FDs. A wiring line 513 is used to connect the FDs 509 to 512 via contacts. Reference character 515 denotes the gate electrode of an amplifier MOS transistor. The wiring line 513 and the gate electrode 515 of the amplifier MOS transistor are contiguously formed of the same material and provided as the same layer. Thus, connection to the amplifier MOS transistor can be enabled without new wiring layers, contacts, and the like for the connection, and an increase in FD capacitance can be suppressed. In the third exemplary embodiment, the wiring line 513 is further connected to the source 514 of the reset MOS transistor via a contact. The wiring lines Res and Tx1 to Tx4 are formed in a first wiring layer, and the power supply line 517 and the output signal line 518 are formed in a second wiring layer, as in the first exemplary embodiment.

An increase in FD capacitance can be minimized by connecting FDs and the gate electrode of an amplifier MOS transistor with a wiring line so that the wiring line extends straight. Specifically, although the FDs 509 to 512 are connected with the wiring line 513 and share the amplifier MOS transistor, the total length of the wiring line 513 is substantially three times as long as a pixel pitch. Even when connection to the gate electrode 515 of the amplifier MOS transistor is considered, connection can be established with a wiring line that is less than four times as long as a pixel pitch. Moreover, a pixel in an even row and a corresponding pixel in an odd row are disposed in a mirror arrangement, the FDs of the pixels being connected to each other, so that the FDs are close to each other. In such a structure, a wiring line for connecting the FDs can be shortened. Thus, capacitance can be reduced.

In the third exemplary embodiment, even when connection to the source 514 of the reset MOS transistor is considered, the total length of the wiring line 513 is substantially four times as long as a pixel pitch. The FDs 509 to 512 are connected with the wiring line 513 and share the amplifier MOS transistor, and the wiring line 513 extends in the same direction as the output signal line 518 and the like. Moreover, the wiring line 513 is formed in a layer different from the layers, in which the output signal line 518 and the like are formed. Thus, capacitive coupling with the second wiring layer including the power supply line 517 and the output signal line 518 can be further reduced.

Fourth Exemplary Embodiment

Figure 6:
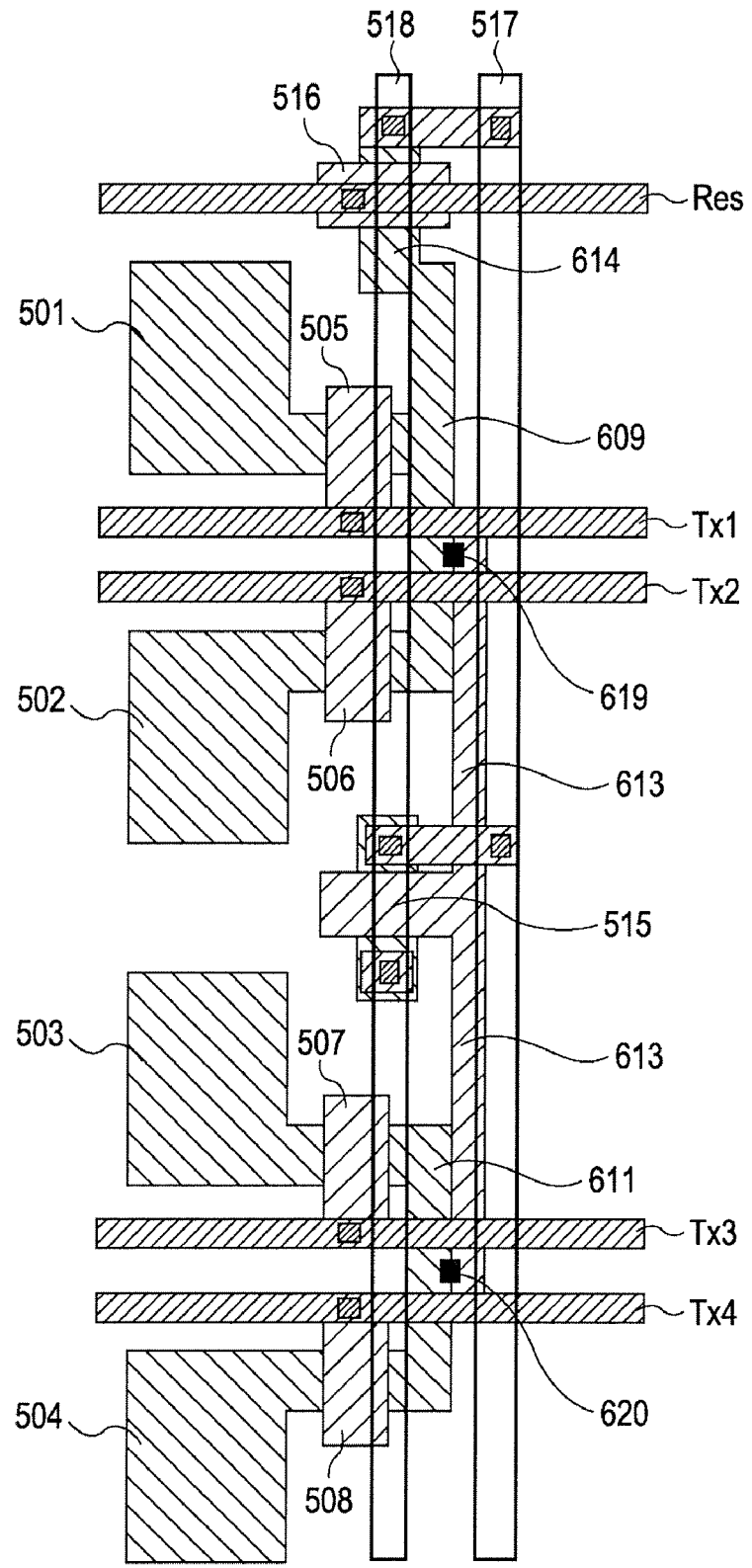
FIG. 6 is an illustration of a fourth exemplary embodiment.

A fourth exemplary embodiment is different from the third exemplary embodiment in that two photoelectric conversion elements share an FD, and two FDs are connected. FIG. 6 shows a specific structure. In FIG. 6, the same reference characters as in FIG. 5 of the third exemplary embodiment are assigned to components having functions similar to the functions of the components shown in FIG. 5, and the detailed description of these components is omitted here.

Reference characters 609 and 611 denote the active regions of FDs. In FIG. 6, two FDs are provided for four photoelectric conversion elements. A wiring line 613 is used to connect the FDs 609 and 611. Reference character 515 denotes the gate electrode of an amplifier MOS transistor. The wiring line 613 and the gate electrode 515 of the amplifier MOS transistor are contiguously formed of the same material and formed in the same wiring layer. A pixel in an even row and a corresponding pixel in an odd row are disposed in a mirror arrangement, the FDs of the pixels being connected to each other, so that the gate electrodes of transfer MOS transistors are close to each other. The FDs are connected with a wiring line. Moreover, the drain 614 of a reset MOS transistor can be formed of the same active region as the FD 609.

In the fourth exemplary embodiment, the wiring line 613 and the gate electrode 515 are formed of the same member so that connection to the amplifier MOS transistor can be enabled without new wiring layers, contacts, and the like for the connection, and an increase in FD capacitance can be suppressed. Moreover, since contacts 619 and 620 that are respectively used to the FDs 609 and 611 to the wiring line 613 can be laid out regardless of the positions of the first and second wiring layers, as in the layouts shown in FIGS. 1A and 4, design flexibility increases. Thus, wiring can be installed so that the first and second wiring layers are disposed close to each other. Accordingly, the aperture of a photoelectric conversion element can be expanded, and the sensitivity of a photoelectric conversion apparatus can be improved.

Fifth Exemplary Embodiment

In a fifth exemplary embodiment, a method for laying out wiring is described. The fifth exemplary embodiment is characterized in that a dummy wiring line is provided. An exemplary layout will now be described with reference to FIGS. 7A and 7B, in which a dummy wiring line is provided in the structure according to the first exemplary embodiment. FIG. 8 shows another exemplary layout in which a dummy wiring line is provided in the structure according to the third exemplary embodiment shown in FIG. 5.

Figure 7A:
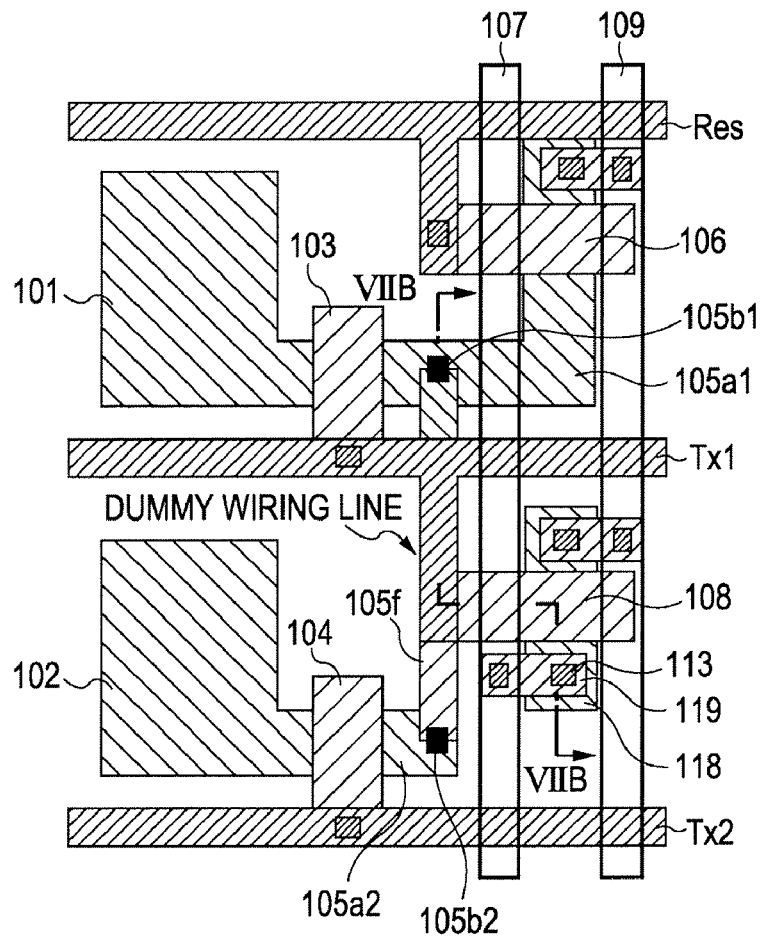
FIG. 7A is an illustration of a fifth exemplary embodiment.
Figure 7B:
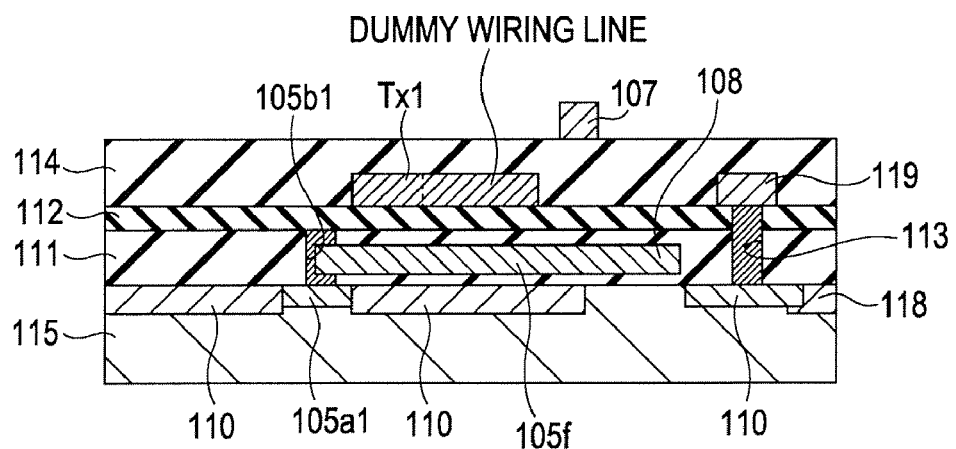
FIG. 7B is a cross sectional view taken along line VIIB-VIIB in FIG. 7A.
Figure 8:
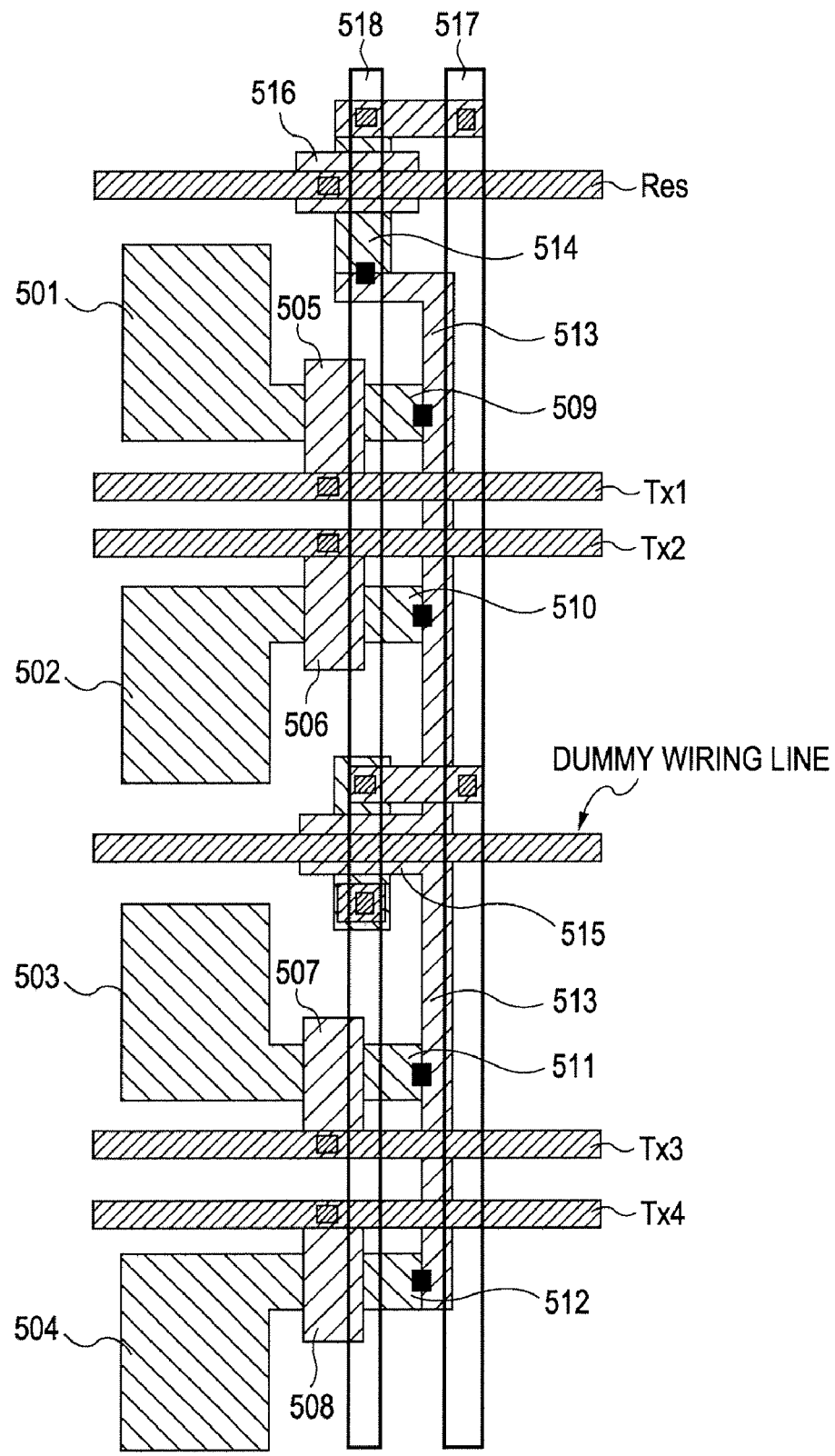
FIG. 8 shows a modification of the fifth exemplary embodiment.

In the layout shown in FIGS. 7A and 7B, a dummy wiring line is disposed above the wiring line 105f. In the layout shown in FIG. 8, a dummy wiring line is disposed above the gate electrode 515 of the amplifier MOS transistor. In the layout shown in FIGS. 7A and 7B, a dummy wiring line is provided so that wiring layouts for the photoelectric conversion elements 101 and 102 are similar to each other. The same applies to the layout shown in FIG. 8. These dummy wiring lines are provided so as to achieve the substantially same conditions of light entering a plurality of photoelectric conversion elements. In these cases, a dummy wiring line is provided. Alternatively, a light-shielding film, a power supply line, a ground wiring line, or the like may have the function of a dummy wiring line.

A layout in which a plurality of photoelectric conversion elements share a reading circuit is effective in downsizing a pixel. However, in this case, the sensitivity behaviors of the plurality of photoelectric conversion elements may vary. When a dummy wiring line is provided as in the fifth exemplary embodiment, the substantially same wiring layout can be obtained for each of the photoelectric conversion elements.

In a structure as shown in FIG. 2A, it is difficult to provide a sufficient number of dummy wiring lines. In contrast, in the structures described in the fifth exemplary embodiment, a wiring line for connecting a plurality of FDs is provided in the same layer as wiring lines for the gates of MOS transistors. Thus, flexibility in designing the layout of dummy wiring lines increases, and the substantially same wiring layout can be obtained for each photoelectric conversion element.

A dummy wiring line is most effective when the dummy wiring line is disposed so as to define an aperture where incident light enters. Defining an aperture means that, in general, an object having a desired pattern defines the outer edges of light entering a photoelectric conversion element. The object is not limited to a wiring line or a light-shielding film. It can be determined, by performing an optical simulation related to the cross section of an element, what object (for example, a wiring line) is a pattern that defines an aperture.

In the structures according to the fifth exemplary embodiment, dummy wiring lines can be readily laid out. Thus, the substantially same conditions of incident light can be achieved for a plurality of photoelectric conversion elements. Accordingly, uniform and satisfactory image signals can be obtained.

Image Pickup System

Figure 9:
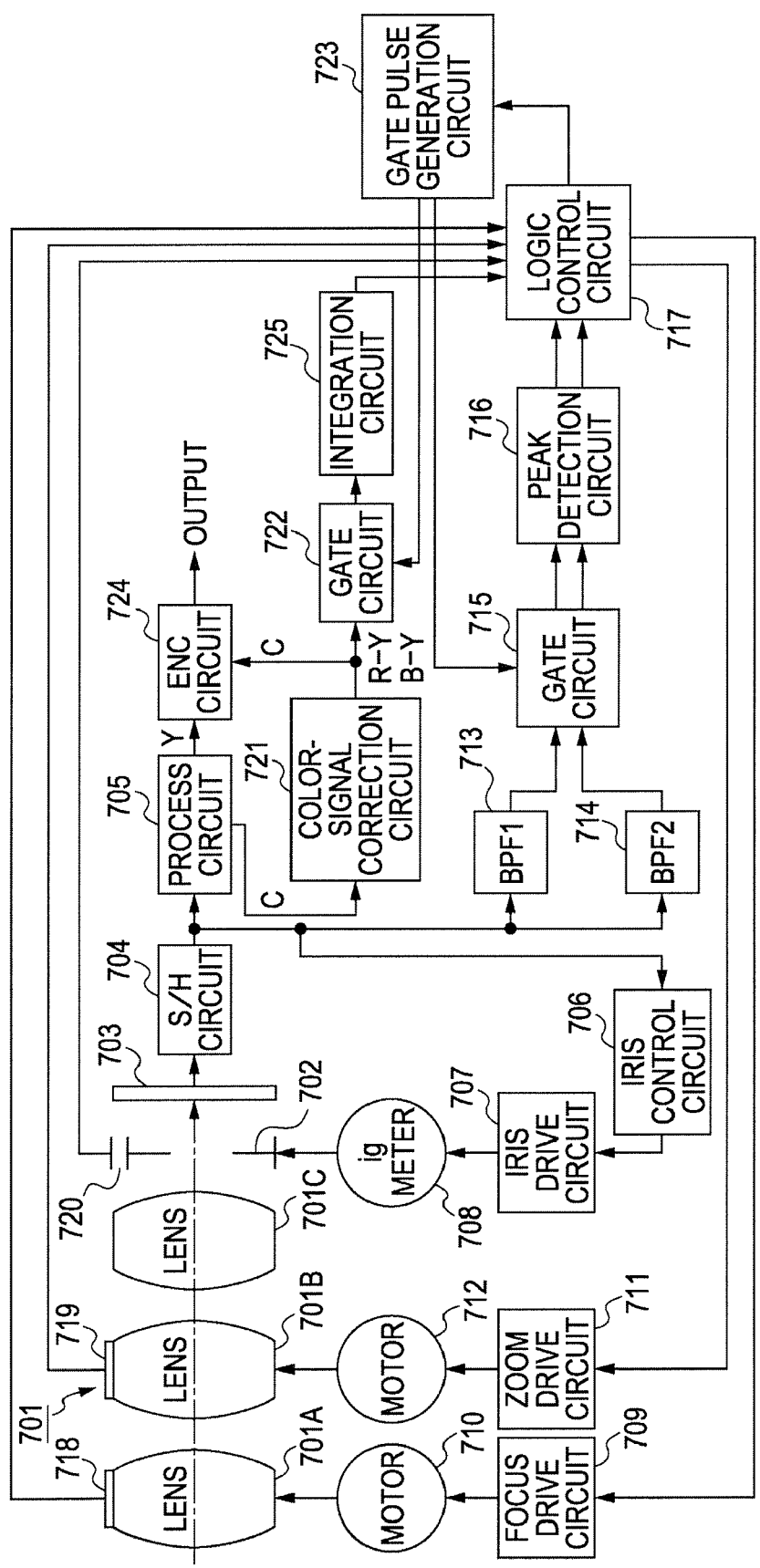
FIG. 9 is a block diagram of an image pickup system.

FIG. 9 is a block diagram of a camcorder that is an example of an image pickup system to which one of the photoelectric conversion apparatuses described in the exemplary embodiments is applied. Another type of image pickup system includes, for example, a digital still camera. The camcorder will now be described in detail with reference to FIG. 9.

An optical system 701 includes a focus lens 701A that adjusts focus, a zoom lens 701B that performs zooming, an imaging lens 701C, and the like. Reference character 702 denotes an aperture and a shutter. A photoelectric conversion apparatus 703 performs photoelectric conversion on an image of a subject formed on an image pickup area to convert the image to electrical signals. An S/H circuit 704 samples and holds the photoelectrically converted signals output from the photoelectric conversion apparatus 703, amplifies the level of the photoelectrically converted signals, and outputs image signals.

A process circuit 705 performs predetermined processes, for example, gamma correction, color separation, and blanking, on the image signals output from the S/H circuit 704. The process circuit 705 outputs luminance signals Y and chrominance signals C. The chrominance signals C output from the process circuit 705 are corrected by a color-signal correction circuit 721 for white balance and color balance and output as color difference signals R-Y and B-Y. The luminance signals Y output from the process circuit 705 and the color difference signals R-Y and B-Y output from the color-signal correction circuit 721 are modulated by an encoder (ENC) circuit 724 and output as standard television signals. Then, the standard television signals are supplied to a video recorder (not shown) or an electronic view finder (EVF) (not shown), such as a monitor EVF. Moreover, the color difference signals R-Y and B-Y are supplied to a logic control circuit 717 via a gate circuit 722 and an integration circuit 725.

An iris control circuit 706 controls an iris drive circuit 707 on the basis of the image signals supplied from the S/H circuit 704, and an iris galvanometer (ig meter) 708 is automatically controlled to control the aperture 702 so that the level of the image signals is kept at a predetermined level.

A first bandpass filter 713 (BPF1) and a second bandpass filter 714 (BPF2) extract, from the image signals output from the S/H circuit 704, high frequency components necessary to detect whether focus is achieved. Individual focus gate ranges of signals output from the first bandpass filter 713 (BPF1) and the second bandpass filter 714 (BPF2), which restrict different bands, are input to a gate circuit 715. Then, a peak value is detected and held by a peak detection circuit 716 and is simultaneously input to the logic control circuit 717. This signal is called a focal point voltage and used to achieve focus. The logic control circuit 717 controls a gate pulse generation circuit 723 to supply gate pulses to the gate circuits 715 and 722.

A focus encoder 718 detects the position of the focus lens 701A. A zoom encoder 719 detects whether focus is achieved with the zoom lens 701B. An iris encoder 720 detects the aperture value of the aperture 702. Detected values in these encoders are supplied to the logic control circuit 717, which performs system control.

The logic control circuit 717 detects whether focus on a subject is achieved on the basis of image signals corresponding to a focus detection area that is set up and adjusts the focus. Specifically, information on a peak value of high frequency components supplied from the first and second bandpass filters 713 and 714 is captured, and the focus lens 701A is driven so that the focus lens 701A moves to a position such that the maximum peak value of high frequency components is achieved. For that purpose, control signals for controlling, for example, the rotation direction, rotation speed, rotation, and stop of a focus motor 710 are supplied to a focus drive circuit 709 to control the focus drive circuit 709. A zoom drive circuit 711 rotates a zoom motor 712 upon receiving an instruction to perform zooming. When the zoom motor 712 rotates, the zoom lens 701B is moved to perform zooming. The camcorder is driven by such operations to capture an image, signals output from the photoelectric conversion apparatus 703 are processed in a signal processing circuit (not shown), and the processed signals are output.

When a photoelectric conversion apparatus according to the present invention is used in such an image pickup system, an image pickup system can be provided, in which an image in which a satisfactory S/N ratio is achieved can be obtained.

In a photoelectric conversion apparatus according to the present invention, an increase in capacitance caused by connecting a plurality of FDs can be reduced, and an image in which the S/N ratio is improved can be obtained. Moreover, since an aperture above a photoelectric conversion element can be expanded, the sensitivity of the photoelectric conversion element can be improved. Moreover, since high flexibility in designing the layout of dummy wiring lines is achieved, the substantially same conditions of incident light can be achieved for a plurality of photoelectric conversion elements.

In the present invention, the conductivity type of an element and the like are not limited to those described in the exemplary embodiments. For example, the structure of a pixel is not limited to those described in the exemplary embodiments.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-209757 filed Aug. 1, 2006, which is hereby incorporated by reference herein in its entirety.

What is claimed is:

1. A photoelectric conversion apparatus comprising:
    a plurality of photoelectric conversion elements configured to convert incident light to electric carriers;
    an amplifier MOS transistor shared by the plurality of photoelectric conversion elements;
    a plurality of floating diffusions connected to a gate electrode of the amplifier MOS transistor; and
    a plurality of transfer MOS transistors arranged to respectively correspond to the photoelectric conversion elements, each of the transfer MOS transistors transferring electric carriers from a corresponding one of the photoelectric conversion elements to a corresponding one of the floating diffusions,
    wherein at least two of the floating diffusions are electrically connected to each other with a wiring line contiguously formed with the gate electrode of the amplifier MOS transistor, and formed of a material that is the same as that of the gate electrode of the amplifier MOS transistor.

2. The photoelectric conversion apparatus according to claim 1, further comprising an output signal line through which signals from the amplifier MOS transistor are output, wherein the wiring line connected between at least two of the floating diffusions is arranged parallel to a direction in which the output signal line extends.

3. The photoelectric conversion apparatus according to claim 1, wherein the electric carriers are transferred from the plurality of photoelectric conversion elements to one of the floating diffusions.

4. The photoelectric conversion apparatus according to claim 3, wherein the wiring line does not overlap an output signal line through which signals from the amplifier MOS transistor are output.

5. The photoelectric conversion apparatus according to claim 1, wherein the floating diffusions and the wiring line are connected with a shared contact.

6. The photoelectric conversion apparatus according to claim 1, wherein the floating diffusions are connected directly to the wiring line.

7. The photoelectric conversion apparatus according to claim 1, wherein the photoelectric conversion apparatus is incorporated in an image pickup system that includes:
    an optical system configured to form an image on the photoelectric conversion apparatus; and
    a signal processing circuit configured to process output signals from the photoelectric conversion apparatus.

* * * * *